United States Patent [19]

Moor et al.

[11] 3,942,135
[45] Mar. 2, 1976

[54] CONCATENATED SURFACE WAVE DELAY LINE CORRELATOR

[75] Inventors: Clinton H. Moor, St. Peters; Carl F. Stolwyk; John J. Vencill, both of St. Louis, all of Mo.

[73] Assignee: McDonnell Douglas Corporation, St. Louis, Mo.

[22] Filed: June 12, 1974

[21] Appl. No.: 478,626

[52] U.S. Cl. .................. 332/11 R; 235/181; 332/26; 333/30 R
[51] Int. Cl.² .................... H03C 3/28; H03H 9/14
[58] Field of Search ............ 332/26, 9 R, 9 T, 11 R, 332/11 D; 333/30 R, 72; 235/181; 330/5.5

[56] References Cited
UNITED STATES PATENTS

| | | | |
|---|---|---|---|
| 3,479,572 | 11/1969 | Pokorny............................ | 330/5.5 X |
| 3,551,837 | 12/1970 | Speiser et al. .................... | 333/72 X |
| 3,675,163 | 7/1972 | Hartmann et al. ................ | 333/30 R |
| 3,818,382 | 6/1974 | Holland et al. ................... | 333/30 R |
| 3,831,044 | 8/1974 | Speiser............................. | 333/72 X |
| 3,831,116 | 8/1974 | Davis et al. ................... | 333/30 R X |
| 3,833,867 | 9/1974 | Solie ................................ | 235/181 X |

Primary Examiner—Alfred L. Brody
Attorney, Agent, or Firm—Charles B. Haverstock

[57] ABSTRACT

A concatenated surface wave device having delay line capabilities for use in correlating electric signals of various types and forms including analog signals, binary signals, and binary modulated signals, said device including means forming a specially constructed conductive surface pattern over which the signals to be correlated are propagated, said surface pattern including input transducer means at a location where input signals to be correlated are introduced for propagation over the surface, a plurality of tap locations on the surface at spaced locations extending away from the input transducer means, and means for sampling a propagated signal at selected surface locations including at selected ones of said tap locations to determine the locations of places where the signals to be correlated are in agreement and are and are in disagreement. The subject correlator also includes means by which signal components can be introduced at selected tap locations along the device.

16 Claims, 8 Drawing Figures

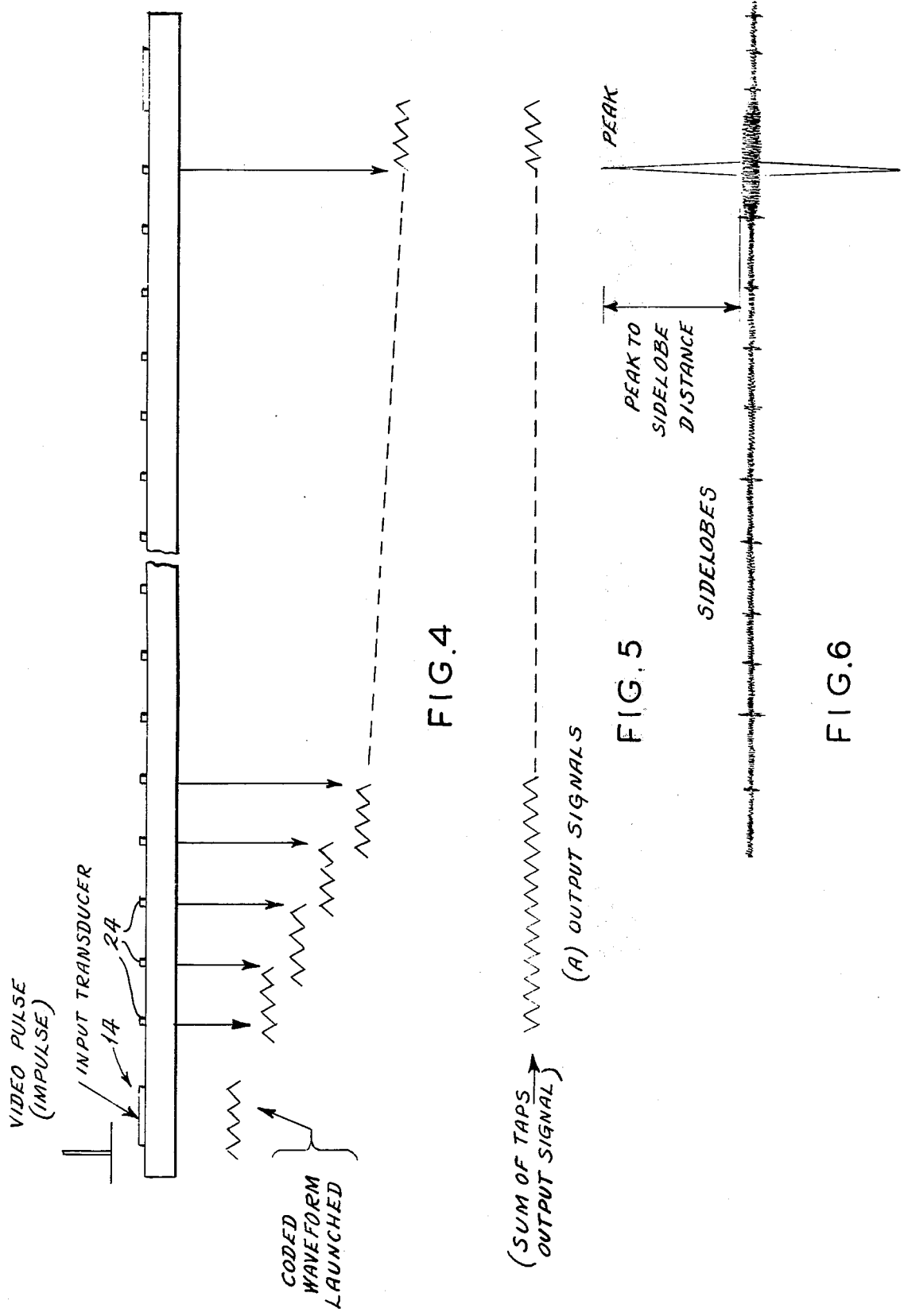

CONCATENATED SURFACE WAVE DELAY LINE CORRELATOR

In many radar, communication, and control systems, it has been demonstrated that the optimum receiver means are often ones that employ some form of correlator. This is because correlators have particularly desirable characteristics in those applications where it is desired to accurately measure some parameter such as the range between cooperating receiver and transmitter units. Correlator means are also useful in pulse compression systems, spectrum spreading and despreading systems, applications employed for pattern recognition and identification, navigation systems, radar signaling applications and data communication applications to name a few. Such applications and systems can be implemented using a tapped surface wave delay line as taught by the present invention. The present invention is embodied in a unique surface wave correlator which alleviates many of the problems associated with prior art programmable surface wave correlators, and it does so in a construction that has a relatively simpler construction than those known in the prior art, and in a construction that has a reduced number of tap locations. The present device also reduces and simplifies the number and complexity of codes which satisfy particular performance criteria and is able to substantially increase the number of codes available, and it makes code evaluation and calculation much simpler, all of which are important advantages.

Various correlator devices have been used before including correlators for phase shift keyed (PSK) signals which are generally designed using tapped delay lines wherein the taps are placed at appropriate intervals to obtain samples of each modulation interval of the signal. For a binary PSK signal including a sinusoidal carrier frequency whose phase is changed according to some sequence of bits, the known devices would need to have their taps spaced according to the bit duration, and the polarity of each tap would be the same as its equivalent bit. In such cases, correlation is performed by adding together the outputs of all of the taps and when the characteristics of the received signal is the same as the characteristic signal of the device itself, the output signal is the autocorrelation function. Signals whose autocorrelation functions have large centrally located peaks and relatively low off-center values sometimes called "sidelobes" are then selected. The peak values of such signals is proportional to n which is the number of bits in a sequence. Also the peak to the sidelobe ratio which is a ratio of the peak lobe energy to the sidelobe energy is a property of the sequence. Furthermore, when correlation occurs, a signal processing gain which is in the nature of a signal-to-noise ratio equal to the peak value of the autocorrelation function, is realized.

The subject concatenated correlator construction has many advantages over the known prior art constructions including the PSK correlator, and the present construction is structurally simpler and is able to establish predetermined characteristics by several different easy to determine parameters including the number of fingers employed, the finger spacing, the number and spacing of the taps, the location of the input transducer means employed including its location relative to the other taps, the materials used in the construction of the members of the correlator, and the manner in which the taps are connected and used to modulate the output wave form. The present device is also uniquely well constructed to introduce weighting functions (amplitude modulation), and to perform filtering and other operations.

It is therefore a principal object of the present invention to provide signal correlator means which are relatively simple structurally, relatively inexpensive to make, and are versatile and able to produce different kinds of correlation outputs and functions.

Another object is to provide a surface wave correlator having taps spaced to respond to different predetermined time displaced locations of the signals being correlated.

Another object is to provide optimum receiver means for use in radar, communication, distance measuring, machine operating and in other devices.

Another object is to teach the construction of a concatenated correlator capable of operating with combinations of short codes to obtain large processing gain which is usually only attendant to devices which use long codes.

Another object is to provide a concatenated correlator of increased flexibility in which long codes occurring as a result of the concatenation are not restricted to maximal length feedback shift register sequences.

Another object is to provide a correlator wherein the number of bits is not restricted to use with a power of two but instead may be selected by the person designing the correlator to have other values as well.

Another object is to provide a correlator that is relatively easily programmed.

Another object is to simplify the introduction of signal weighting factors into surface wave devices.

Another object is to substantially increase the flexibility and versatility of signal surface wave devices.

Another object is to be able to program a surface wave correlator by coding which may be accomplished using fewer switches.

Another object is to provide a concatenated surface wave correlator that is relatively less susceptible to defects produced during manufacture because it requires fewer fingers than known constructions to obtain the same performance characteristics.

Another object is to achieve increased processing gain in a correlator having substantially fewer taps.

Another object is to make it much easier to find useful codes for a correlator.

Another object is to be able to more accurately predict the characteristics of relatively long codes knowing in advance only the characteristics of relatively shorter codes which are easier and less expensive to evaluate.

Another object is to provide a surface wave device having more nearly matched input and output impedance characteristics than known correlator devices thereby minimizing insertion losses and simplifying the construction and design of other devices and systems for interfacing therewith.

Another object is to teach the construction and operation of a signal processing device having improved performance when operating with phase coded signals and when using a quartz substrate.

Another object is to employ a concatenated code structure which increases the fractional bandwidth capability, reduces distortion caused by tap reflections and permits programmable devices of large bandwidth-time products to be easily fabricated.

Another object is to teach the construction of a surface wave device which can be programmed and operated under adverse environmental conditions and which has a relatively large bandwidth-time product.

Another object is to increase the fractional bandwidth capability of quartz by using signal processing which includes code concatenation.

Another object is to devise a signal processor which may be operated at significantly lower center frequencies for a given bandwidth without incurring the usual insertion loss penalties.

Another object is to improve the peak-to-sidelobe ratio of surface wave devices.

Another object is to teach the construction and operation of a relatively versatile surface wave device which can be used in many different applications and systems including data transmitting and receiving systems, pulse compression systems, spectrum spreading and despreading systems, pattern recognition systems, identification systems, navigation systems, radar systems, distance measuring systems, and synchronizing systems to mention a few.

These and other objects and advantages of the present invention will become apparent after considering the following detailed description of a preferred embodiment thereof in conjunction with the accompanying drawings wherein:

FIG. 4 is an enlarged side view of the subject surface wave device showing graphically a form of output signal produced at succeeding tap positions therealong;

FIG. 5 shows a typical output waveform representing the sum of the outputs of all of the taps included in the device shown in FIG. 1;

FIG. 6 is a graph of an autocorrelation function obtained by the subject device;

Figure 1:
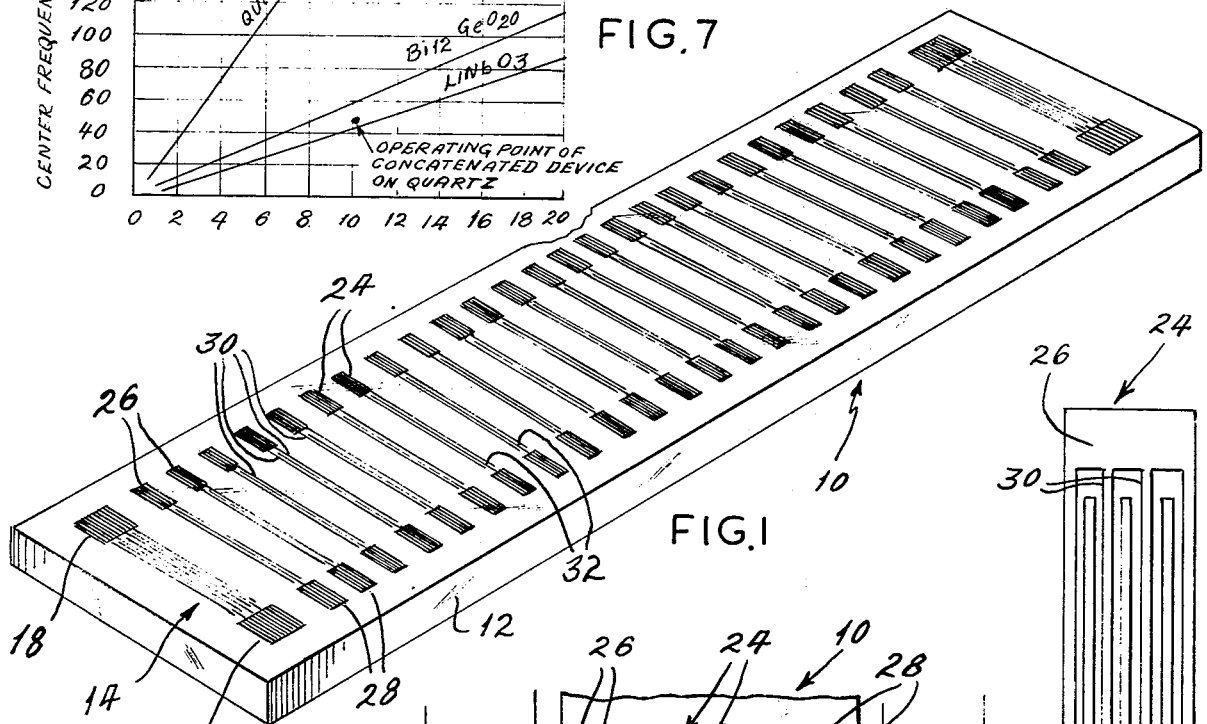
FIG. 1 is a perspective view of a surface wave device constructed according to one embodiment of the present invention.

Referring to the drawings more particularly by reference numbers, number 10 in FIG. 1 refers to a concatenated correlator constructed according to one form of the present invention. The correlator 10 includes a non-conductive substrate 12 formed of a material such as glass, quartz or some other suitable material. A pattern of a highly conductive material such as a highly conductive metal is formed on a surface of the substrate 12. Metals such as aluminum or gold can be used to form the surface layer pattern although it is also contemplated to use other conductive metals as well. The pattern forming material can be formed on the substrate 12 by being deposited thereon using masking or other means as desired or it can be formed by metal that remains on the substrate following an etching process similar to those used in the semi-conductor industry. The conductive pattern can also be formed on the substrate by an evaporation and condensation process or by projecting a vaporized beam or mist of the desired material at the substrate in some controlled manner such as for example by an ion beam deposition technique or the like. One such ion beam deposition technique is disclosed in Baker et al U.S. Pat. No. 3,245,895, dated Apr. 12, 1966, which is assigned to Applicants' assignee.

The selection of a specific design for the pattern of material deposited or otherwise formed on or attached to the substrate 12 may vary considerably as desired and depends upon the characteristics to be achieved. For example, the pattern can have different numbers and sizes of conductive fingers, different finger spacings, different tap spacing, different numbers of taps and different arrangements of the fingers and the taps. The physical size and shape of the substrate 12 and the pattern deposited or otherwise formed thereon can also be varied depending upon the purpose and application for which the device is to be used.

Referring again to FIG. 1, the pattern which is deposited or otherwise formed on the substrate 12 includes at least one input portion or transducer portion 14 at which input signals to be correlated are introduced or propagated. Only one input transducer 14 is ordinarily required in the operation of the subject device although the drawings show a construction which has a similar input transducer located adjacent each opposite end. This may have advantages in some applications. The input transducer 14 is a coded structure in the subject concatenated correlator, and the details of a typical input transducer construction are shown greatly enlarged in FIG. 2. The input transducer 14 is shown as having a coded physical structure whereas in the usual more conventional design of surface wave correlators the transducers are not so coded. This difference between the subject construction and the more conventional constructions is an important difference and one which will be more fully explained hereinafter.

Figure 2:
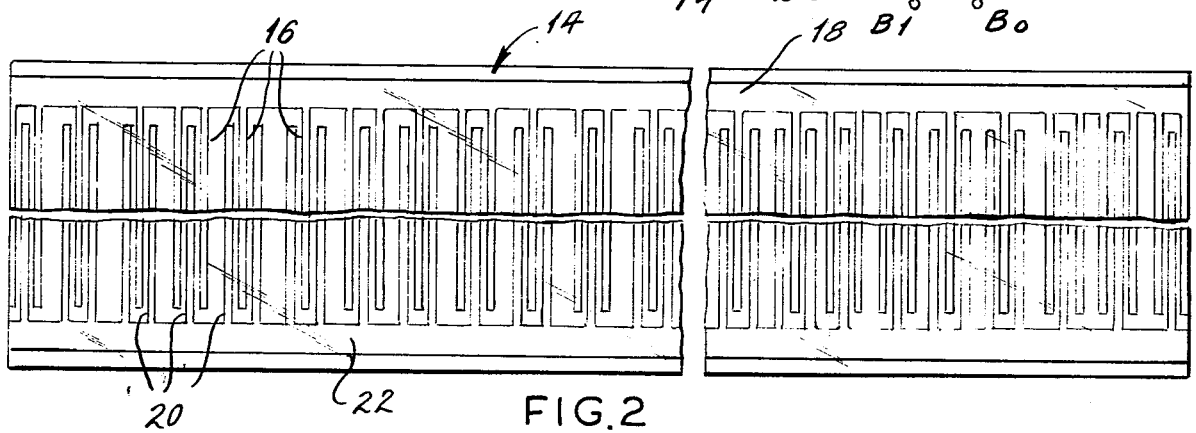
FIG. 2 is an enlarged fragmentary top plan view showing the details of the input transducer portion of the device of FIG. 1.

In FIG. 2 the input transducer 14 is shown as being formed by a plurality of closely spaced sets of adjacent fingers which extend from adjacent opposite sides of the surface of the substrate in spaced relationship along a portion of the device. Some of the fingers such as the fingers 16 are connected to a first conductive strip or bus 18 which extends along one side of the transducer 14, and other fingers such as fingers 20 are connected to another conductive strip or bus 22 which extends along the opposite side of the transducer 14, and the fingers 16 and 20 extend into the spaces between each other like the teeth of two oppositely directed combs. In the particular input transducer construction as shown, each group of three fingers has two fingers of which are connected to the conductor 18 (or 22) on one side of the device and the third is connected to the conductor 22 (or 18) on the opposite side of the device. However, as can be seen, the fingers in each group of three fingers are position coded in their respective groups along the transducer in some particular predetermined manner. This is illustrated by the distinctive finger pattern as shown wherein it can be seen that there is not a symmetrical or necessarily regular relationship between the groups which have two fingers connected to the conductor 18 and those which have two fingers connected to the conductor 22. The finger arrangement from group-to-group, can be varied as desired. It is apparent from FIG. 1 that some of the groups of three fingers have been inverted with respect to the leftmost group as indicated, and this inversion results in a binary encoded PSK-modulated waveform being launched by the input transducer 14 when activated by an impulse of electrical energy. The packet of waves released in such a case is significantly different from the wave packet usually associated with input transducers since it is a coded or modulated waveform. This modulated wave packet travels along the surface of the substrate and in so doing moves past each tap 24 on the surface of the device 10. As it passes each of the taps 24 an electrical output is generated due to the piezoelectric effect. The output signals at the various taps occur at different times due to their physical separation or spacing along the substrate. Generally, the adjacent taps 24 are spaced apart a distance that is equal to the length of the input transducer waveform which is the same as the length of the input transducer 14. This means that as the last portion or trailing edge of a wave packet leaves the first tap, the leading edge will just reach the second tap and so on as the wave moves along the device 10. Therefore, by electrically connecting the taps together, a continuous output signal is obtained that lasts for the period of time it takes for the wave packet to travel from the first tap 24 which is the tap nearest the input transducer 14 to the last tap 24. This is illustrated in FIG. 4 where the respective portions of the output signal produced at each of the taps 24 are shown, each portion occurring at a different time depending upon when the signal passes each tap. FIG. 5 shows the sum of the individual tap outputs shown in FIG. 4, and FIG. 6 is a graph of a typical autocorrelation function obtainable with the present device.

In addition to modulation that may be impressed upon the input wave packet by the input transducer 14, the taps may also be controlled and used to modulate the output wave form. For example, the taps may be designed and connected to means which add a weighting function (amplitude modulation), a phase shift (frequency or phase modulation), or perform filtering or some other operation on the signal as it moves past. The weighting function is obtained and observed when the finger overlap is varied as will be explained.

Figure 3:
FIG. 3 is an enlarged view showing the construction details of a typical tap employed in the surface wave device of FIG. 1.

The different forms of modulation are obtained in different ways. Amplitude modulation, for example, can be produced by placing different voltages on the different taps. Phase modulation is obtained by inverting or by shifting the taps 24 with respect to a reference tap, and frequency modulation is obtained by varying the finger spacings within each tap. The amount of filtering that is produced is controlled by the number of fingers that are used in each of the taps. All of these variables can be controlled and used depending upon the purpose and application for which the correlator is to be used and the type of modulation to be produced. In the case of a PSK correlator, all of the taps have the same number of fingers and the same finger spacing such as is shown in the construction of FIGS. 1, 2, and 3, for example. The weighting function in the PSK situation has values that vary from +1 to −1 where −1 corresponds to a phase inversion. With this construction, the tap phase sequence impresses a binary code upon the output signal, and this coding can be described as being concatenated coding inasmuch as it is a combination of the input transducer code and the code that is impressed by the weighting function applied to the signal as it moves past the taps 24.

Another way to consider the operation is to think of the code imposed by the input transducer as being the inner code and the modulation or coding applied by the tap positions 24 as being the outer code. When a signal is applied to the input transducer 14 and is encoded according to the inner code it thereafter travels down the surface of the subject device 10 past the various tap locations, and the taps multiply each bit of the input transducer code (inner code) so that the total number of bits in the output signal is the product of the number of bits in each code, namely, the product of the inner and outer codes.

Referring again to FIG. 1, each of the taps 24 includes spaced bus portions 26 and 28 similar to the bus portions 18 and 22 associated with the input transducer 14 (FIG. 2) and the buses 26 and 28 are located adjacent opposite sides thereof or at the opposite ends of respective fingers 30 and 32. The bus bars 26 and 28 are used as means to make external electrical connections to the fingers in the taps 24 and the bus bars can be continuous or discontinuous at each tap or between taps along the device depending on the weighting or other connections made thereto. The buses can also be used as input and as output means. In the case where only one inner code and one outer code is desired, these external connections can be made permanently. For example, connecting corresponding ends of all of the taps together along both sides of the device results in a device that is set up for one code only. To change this code, the device should be designed in a different way as will be explained. For a binary-encoded PSK device where the weighting factor of each tap is either +1 or −1, the −1 value can be obtained simply by physically inverting the tap or by interchanging the electrical connections thereto. This flexibility enables the device to be easily programmed for binary PSK signals.

Figure 8:
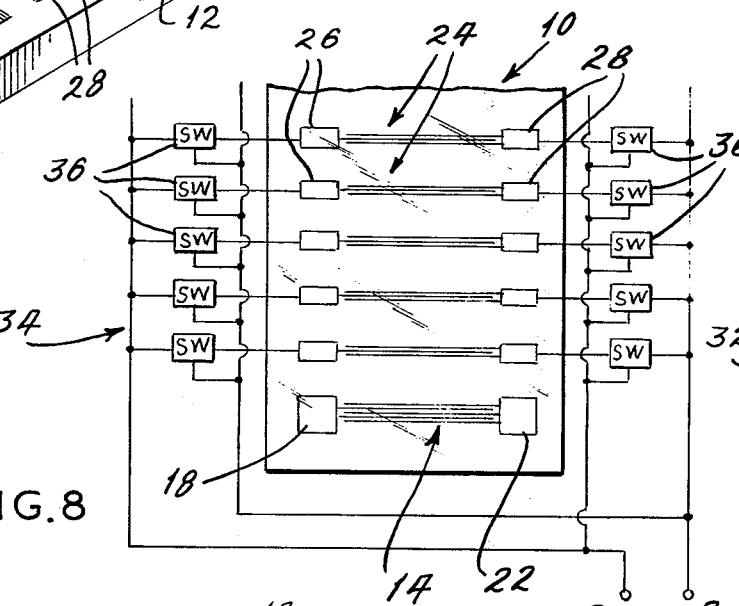

The device can also be made to be used with a large number of codes by connecting switching circuits 34 (FIG. 8) to selected ones of the taps 24 using connections to the associated bus bars 26 and 28 rather than by connecting the taps directly together using bus bar connections such as the bus bar connections 18 and 22. If this is done, the desired operating codes can be fed to and through the switching circuits 34 which operate to determine the value of the weighting function (+1 or −1) to be applied to each tap, and the switching circuits 34 therefore control the connection thereof to the bus bars or other connections accordingly. The switching circuit as shown in FIG. 8 includes a bistable switching device 36 associated with each tap bus 26 and 28 and each switching device has two input connections one being connected to a source of binary one ($B_1$) inputs and the other to a source of binary zero ($B_0$) inputs. This type of tap programming using switches can be employed for use with the inner code (input transducer 14), for use with the outer code by switch connections to the taps 24, or for use with both the inner code and the outer code simultaneously.

The concatenation of two codes may be represented as the product of two sequences individually selectable by the switch connections to the various buses, and the concatenation of the two codes may be represented as the product of the two sequences. Furthermore, the switching means selected for use can be solid state switching devices or gates of various known types and constructions including being parts of one or more integrated circuits.

If the inner code designated by the symbol $X$ is represented by the expression $X = (X_i)$, the outer code designated by the symbol $Y$ is represented by the expression $Y = (Y_i)$, and if each of these codes is a sequence of length $m$ and $n$ respectively, then the correlation function ($Z$) can be expressed by the equation:

$$Z(j) = X \cdot Y \text{ with } Z_{rn+s} = x_s y_{r+1}$$

where $r$, $n$ and $s$ are integers and where $j = rn + s$. For the same conditions, the non-periodic autocorrelation function ($C$) can be expressed as:

$$C_{qn+r}(X \cdot Y) = C_r(X)\, C_q(Y) + \overline{C}_{n-r}(X)\, C_{q+1}(Y)$$

where $q$ is an integer from 0 to $n$, and $j$ has a value from 1 to $n^2$, for the conditions where $q \geq 0$ and $r < n$, and the periodic autocorrelation function ($a$) is:

$$a_{qn+r}(X \cdot Y) = C_r(X)\, a_q(Y) + \overline{C}_{n-r}(X)\, a_{q+1}(Y)$$

where $\overline{C}$ is the complex conjugate of $C$.

The subject concatenated correlator has many advantages over other correlator constructions especially those that use only a single code. Some of the advantages include the fact that the subject device is able to make use of combinations of relatively short simple codes to obtain relatively large processing gains which heretofore are usually attendant only to longer codes. Furthermore, the longer codes occurring as a result of the concatenation obtained by the present device are not restricted to maximal feedback shift register sequences, and therefore the number of bits is not restricted to a power of two and may essentially be selected by the designer. As explained above, the total number of possible bits obtainable using the subject construction is the product of the number of bits in each of the two codes being combined and this fact is a tremendous advantage. Furthermore, the subject device is relatively easy to program since not all of the code elements have to be available for programming and the coding may be accomplished using a number of simple well known switches equal in number only to the sum of the bits in the two codes and not to the product of the codes as would be the case if the longer code were to be used in a known construction. In other known approaches, the number of switches required would have to be equal to the product of the number of bits in each of the two codes and this could involve a very substantial number of switching devices as compared to those required for the present construction. Furthermore, the present construction is easier to manufacture than the known devices and is less susceptible to defects than prior art devices that use other designs to achieve the same processing gain achieved by the present construction. This also means that fewer fingers are required in the present device to obtain the same performance that is obtainable by other constructions having a greater number of fingers. In other words, the present construction is able to obtain a processing gain (number of possible code positions) for a correlator having N taps with only approximately $\sqrt{N}$ taps, and this in large part is due to being able to use a code input transducer in the present construction.

Also with the present construction it is easier and less expensive to find useful codes and it is possible to more easily predict the characteristics of longer codes simply by knowing the characteristics of the shorter codes which are selected. This is because shorter codes are more easily and inexpensively determined and applied. It is also a significant advantage of the present construction that the input and output impedances are more nearly matched than in other known designs, and this is true largely because there are fewer fingers and therefore less interfinger capacitance, and this reduces the insertion losses and makes it possible to more easily and accurately interface the subject device to other systems and system components than is the case with known devices.

To increase or decrease the relative maximum output or processing gain achieved by the subject device is a simple matter of adding or removing some of the taps. Since the properties of long codes are relatively expensive and time consuming to determine, as stated, it is highly desirable to be able to use shorter codes in the manner taught while at the same time obtaining the large processing gains attendant to the longer codes and also be able to obtain good autocorrelation properties which are usually associated only with the shorter codes. It can therefore be seen that the subject construction enables short codes to be combined in such a manner, herein referred to as by concatenation, as to obtain large processing gains and good autocorrelation properties.

The subject correlator including the chip coded input transducer 14 and the plurality of spaced segmented coded taps 24, are arranged on a substrate material capable of supporting surface waves. Suitable materials for the substrate 12 include substances such as single crystal quartz, and the surface elements can be made of the substances mentioned above as well as other conductive materials. Other materials can also be used including for the substrate materials materials such as lithium niobate ($LiNbO_3$), bismuth germanium oxide ($Bi_{12}GeO_{20}$), lithium tantalate, quartz including ST quartz and there may be other suitable piezoelectric materials as well including substances such as glass and other crystal substances.

As explained, the subject concatenated construction enables the production of codes having a length of $n^2$ which can be generated using two shorter codes of length $n$, and the peak-to-sidelobe ratio of the longer codes which are produced as a result of concatenation will approximate that of the shorter codes. Heretofore, the peak-to-sidelobe ratio for a specific length sequence, which is code dependent, generally had to be computed for each code. However, for concatenated codes this ratio is easily determined and one computation applies to all codes of a given length. Furthermore, the peak occurs when $q = r = 0$, and can be expressed by the equation:

$$P_{xy} = C_x(0)\, C_y(0) = n^2$$

In the equation $n$ is the number of chips in each code sequence, and the sidelobe maximums occur at times when $q = 0$ and $r \neq 0$ in which case the equation for the sidelobes becomes:

$$S_{xy} = nC_x(r) + C_x(n-r)\, C_y(1)$$

From this equation it can be seen that the maximum sidelobes of the concatenated code can be determined directly from the sidelobes of the shorter lobes and this is an advantage. For example, consider two 25-chip length codes each having a peak-to-sidelobe ratio of 25/3. If $r$ equals an even number, then $n-r$ is odd. Since $C_x(r)$ is odd, $C_x(n-r)$ and $C_y(1)$ are even, and the maximum values are then:

$$C_x(r) = 3$$

$$C_x(n-r) = 2$$

$$C_y(1) = 2$$

Therefore, the sidelobe energy $S_{xy} = 3N + 4 = 79$ where $N = 25$. For this case the peak-to-sidelobe ratio, which is the ratio of the magnitude of the peak lobe to the largest side lobe, for all such codes is:

$$P_{xy}/S_{xy} = N^2/79 = 625/79 = 7.9 \text{ or } 17.9 \text{ dB}$$

From this it can be shown that the peak-to-sidelobe characteristics of concatenated codes using the present construction are much smaller in relation to the length of the code as compared to single codes.

An important consideration is selecting a coding technique is in the selection of the cost of building a code library. Computer searches for long codes having certain desired autocorrelation characteristics are expensive and time consuming to make. Therefore, an advantage of building long codes from shorter codes is that the characteristics of such codes can be relatively more easily determined from the short codes and a code library can be generated at much less expense. For example, over 1,000 20-chip sequences exist with a sidelobe level of 3 or less, and approximately 1,000 25-chip sequences exist which have sidelobe levels of 3 or less. This means that approximately $2^{20}$ or $10^6$ code output variations are possible for a code that has 400 possible combinations while a device that has 625 possible combinations can produce $2^{25}$ or about 3.36 ($10^6$) variations using the concatenated technique, and this does not even include codes that are complements, reverses or complementary reverses of one another, or those obtained by the addition of a clock signal. Thus the advantages of using short codes to build code libraries where the library has codes that are combinations of the shorter codes are many and varied.

Figure 7:
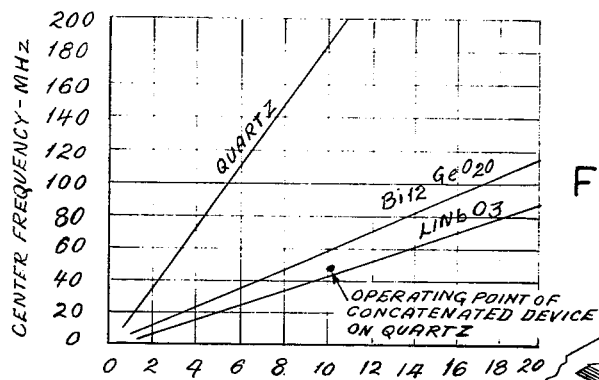
FIG. 7 is a graph of the center frequency in megaHertz as a function of the chip rate also in megaHertz for different substrate materials; and, FIG. 8 is a schematic circuit diagram showing typical switching circuits and the connections thereto to the present surface wave device.

Another advantage of concatenated operation is that it permits the input transducer to be designed to achieve a minimum insertion loss for certain substrate materials such as quartz. It has been found that the optimum number of finger pairs for ST quartz is 22 and this limits the operating frequency of conventional correlator designs to that shown in FIG. 7 if minimum insertion loss is to be achieved. In a concatenated construction, on the other hand, the number of finger pairs in the transducer is dependent only on the intercode, and processors that have been developed using 20 and 25-chip intercodes are able to operate at 45 MHz center frequency with nearly the same insertion loss as conventional designs which operate at much higher frequencies. As explained above this is due to less interfinger capacitance. This results in operation at a fractional bandwidth as compared to optimum conventional designs on substrates of material such as lithium niobate for example. This property of the present construction permits for a relatively free choice of operating frequency and chip rate. The operating frequency dictates the design and the parameters of the individual finger pairs while the signal chip rate dictates the spacing between the finger pairs. However, the number of finger pairs remains constant thereby permitting wide latitude in the choice of both the center frequency and the chip rate while providing a relatively low insertion loss.

Another significant advantage obtained from this form of coding is the application of code programmable processors. Code programmable processors of conventional design require the use of a separate programming switch for each code element. For a conventional device having a length of $n^2$ chips, $n^2$ switching circuits and memory stages are therefore required. On the other hand, for a concatenated processor of the same length using the teachings of the present invention both the inner and outer codes may be programmed individually and the total number of switching devices required instead of being $n^2$ is only $2n$. This means that for a process of length 625 chips, the number of required switching circuits is reduced from 625 to 50 an obvious and significant advantage.

It can be shown that the use of center frequencies in the IF region is necessary to permit devices with a total length in the range of 20 microseconds or more to operate while maintaining less than about 3 dB of degradation over the desired temperature range. A center frequency of 45 MHz, which gives a convenient choice for a high frequency, has been shown to be compatible for operation with a 62.5 microsecond processor even when operated in a temperature range from $-55°$ to $+105°C$.

When the subject device is used with switches such as with the switching circuit 34, shown in FIG. 8, the switches used can have many different forms including being solid state switching devices and circuits such as two PIN diodes in parallel and an associated biasing circuit. With this type of construction, the programming information which is applied to the associated buses can be entered in either a serial or parallel fashion. An actual concatenated structure programmed in this manner demonstrated that it could be programmed with relatively little measurable degradation as compared to other prior art constructions using fixed codes.

Thus it has been shown and demonstrated that the subject surface wave signal processor has relatively large time-bandwidth product characteristics and is able to operate satisfactorily over a wide range of temperature conditions without encountering excessive degradation. Furthermore, a surface wave device such as the subject device employing concatenated coding allows the use of quartz and other similar materials to be designed to have a large fractional bandwidth without incurring the usual insertion loss penalties normally associated with such devices. Also, the simplified electrode structure of the subject concatenated device enables a fully programmable device to be constructed with a considerable reduction in the number of switching circuits as indicated above, and with an associated reduction in distortion which results from the reduction in number of metalized electrodes as compared to conventional designs.

Thus there has been shown and described a novel surface wave device which fulfills all of the objects and advantages sought therefor, and which operates as a concatenated device with respect to the signal or signals applied thereby substantially enlarging the number of possible codes and code variations without sacrificing any of the advantages normally associated with devices which operate using only relatively short codes. It will be apparent, however, that many changes, variations, modifications and other applications and uses for the subject device will become apparent to those skilled in the art after consideration of this specification and the accompanying drawings. All such changes, alterations, modifications and other applications and uses which do not depart from the spirit and scope of the invention are deemed to be covered by the invention which is limited only by the claims which follow.

What is claimed is:

1. A surface wave device comprising a dielectric substrate member having a surface formed thereon over which signals are propagated, conductive means formed on said surface including a plurality of spaced conductive fingers arranged in a row of finger groups extending along said surface, the fingers extending transversely to the direction of movement of the propagated signals, means forming tap connectors to selected ones of said fingers, said tap connectors being located adjacent at least one side of said row of fingers, an input transducer formed by a plurality of spaced conductive fingers located in spaced relationship to one end of said row of fingers, other tap connectors to the input transducer fingers, input means connected to selected ones of the tap connectors including the other tap connectors, said input means including a source of electric signals for applying to said fingers of the input transducer for propagation over the substrate surface and along the row of finger groups, the fingers of said input transducer being located and controlled to apply a first encoding to the input electric signals, and the fingers of said row of finger groups being located and controlled to apply a second encoding to the encoded electric signals propagated thereby, said propagated signals being encoded according to a product of the encoding applied thereto by the fingers of the input transducer and the fingers of the row of finger groups.

2. The surface wave device defined in claim 1 wherein the fingers of the input transducers and the row of fingers are in alignment on said substrate surface.

3. The surface wave device defined in claim 1 wherein the row of fingers are arranged in spaced finger groups along the surface, the spacing between adjacent finger groups in said row of fingers having a fixed relation to a dimension of the input transducer.

4. The surface wave device defined in claim 1 wherein the input means includes first and second sources of encoded electric signals, means for applying the electric signals from the first source to selected other tap connectors associated with the fingers of the input transducer and means for applying the electric signals from said second source to selected tap connectors associated with fingers in the row of finger groups.

5. The surface wave device defined in claim 1 including a similar input transducer located adjacent each opposite end of the row of fingers.

6. The surface wave device defined in claim 1 including means connected to selected tap connectors of the row of fingers to sample the propagated signal thereat.

7. The surface wave device defined in claim 1 including switching means connected to selected tap connectors, said switch means being a plurality of gate circuits each having a first gate input connected to a first source of electric signals, a second gate input connected to a second source of electric signals, and a gate output connected to tap connectors associated with the fingers of the input transducer and the fingers in the row of fingers.

8. The surface wave device defined in claim 1 wherein the tap connectors are arranged in spaced rows along opposite sides of the row of fingers, the tap connectors along one side of the row being connected to preselected ones of the fingers and the tap connectors along the opposite side of the row being connected to the other fingers in the row.

9. A surface wave device comprising a dielectric substrate member having a surface thereon over which signals to be modulated are propagated, means forming a row of spaced conductors on said surface, said conductors being oriented normal to the direction of signal propagation and arranged in said row in substantially equispaced groups, a second group of spaced conductors on said surface adjacent to one end of the row of spaced conductors, conductive means on said surface connected to selected ones of the conductors in said row and in said second group, a source of encoded electric responses and means connecting said source to selected ones of the conductive means, the electric responses having a modulating effect on signals propagated along said row of conductors, the modulation produced by the encoded electric responses applied to the conductive means associated with said second group combining with the electric responses applied to the conductive means associated with said row of conductors to produce a resultant modulating effect on the propagated signal that is a product of the encoding of the electric responses applied to the conductors of said row and of said second group.

10. The surface wave device defined in claim 9 wherein the conductors in said row and in said second group are arranged on said substrate surface in alignment.

11. The surface wave device defined in claim 9 including a switch circuit formed by a plurality of gate devices each having input and output connections, said source of electric responses including a source of a first frequency connected to selected inputs of the gate devices, the frequency of said electric responses having a predetermined relation to the frequency of the propagated signal, and means connecting the output connections of selected ones of the gate devices to different ones of the conductive means along the row of conductors.

12. The surface wave device defined in claim 11 including a second switch circuit including at least one second gate device having input and output connections, said source of electric responses including a second source of input electric responses connected to the input connection of said second gate device, and means connecting the second gate output connection to the conductive means associated with the second group of conductors.

13. A surface wave device comprising a piezoelectric substrate having a surface thereon, means for propagating an encoded signal to be modulated over said substrate surface, means forming a plurality of spaced conductive strips positioned in a row extending along said surface in the direction in which the signal to be modulated is propagated, said strips being oriented perpendicular to the direction of propagation and arranged in spaced groups along said row, means for modulating the encoded signal propagated along said row of strips including a first source of electric modulating signals of predetermined frequency, means connecting said first signal source to selected strips in said groups of strips and a second source of electric modulating signals having distinctive frequency characteristics, means connecting said second source to selected strips in one of the groups of strips, said first and said second signal sources modulating the propagated signal according to a product of the modulating frequencies of the first and second signal sources.

14. A concatenated surface wave delay line comprising a piezoelectric substrate member having a surface over which a signal to be modulated is propagated, means formed on said surface extending in the direction of signal propagation including a plurality of spaced elongated conductive members arranged in spaced groups in a row on the surface with the individual conductive members in said row being oriented normal to the direction of signal propagation, an input group of spaced conductive members positioned on said surface in alignment with said row but spaced from one end thereof, the conductive members of said row of spaced groups including the connections thereto being arranged to distinctively modulate signals propagated along said row, the conductive members in the input group including the connections thereto being arranged to distinctively modulate signals propagated by said input group, said modulating means including first and second input signal sources each having distinct modulating frequency characteristics, means connecting the first signal source to selected conductive members in the groups which form the row, and means connecting the second signal source to selected conductive members in the input group, the propagated signal being modulated according to a product of the modulating characteristics of the first and second signal sources.

15. The delay line defined in claim 14 including a source of different potentials representing different distinct binary conditions, a switching circuit connected between said binary signal source and the selected conductive members, said first signal source including means to control the switching circuit to control the binary potential applied to the selected conductive members in said row, the binary potentials applied to the respective conductive members having a first modulating effect on the propagated signal.

16. The delay line defined in claim 15 including a second switching circuit connected between the binary signal source and selected conductors of said input group, said second signal source including means to control said second switching circuits to control the binary potential applied to the conductive members of said input group, the binary potentials applied to the respective conductive members of said input group having a second modulating effect on the propagated signal, the combined modulating effect on the propagated signal due to the first and second modulating effects being a product of said modulating effects.

* * * * *